(12) United States Patent
Appaswamy et al.

(10) Patent No.: US 10,134,721 B2
(45) Date of Patent: Nov. 20, 2018

(54) VARIABLE HOLDING VOLTAGE SILICON CONTROLLED RECTIFIER USING SEPARATE AND DISTINCT BIPOLARS

(71) Applicant: TEXAS INSTRUMENTS INCORPORATED, Dallas, TX (US)

(72) Inventors: Aravind C Appaswamy, Plano, TX (US); Farzan Farbiz, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/224,946

(22) Filed: Aug. 1, 2016

(65) Prior Publication Data

US 2018/0033784 A1    Feb. 1, 2018

(51) Int. Cl.
*H01L 27/00* (2006.01)
*H01L 27/02* (2006.01)
*H01L 29/74* (2006.01)

(52) U.S. Cl.
CPC ...... *H01L 27/0262* (2013.01); *H01L 29/7408* (2013.01)

(58) Field of Classification Search
CPC .................................................. H01L 27/0262
See application file for complete search history.

(56) References Cited

U.S. PATENT DOCUMENTS

2004/0099896 A1*   5/2004   Zdebel .............. H01L 21/82285
                                                                257/302

* cited by examiner

*Primary Examiner* — William Harriston
(74) *Attorney, Agent, or Firm* — Jacqueline J. Garner; Charles A. Brill; Frank D. Cimino

(57) ABSTRACT

A silicon controlled rectifier (SCR) using separate bipolar transistors is disclosed. The separate bipolar SCR enables access to internal feedback terminals of the SCR, which may then may be used to adjust the gain of individual bipolar transistors. Further embodiments provide custom design latch up immune solutions. The latch up immunity is achieved by integrating an active Field Effect Transistor (FET) into the internal feedback node of the SCR. This provides access to 'feedback' node of the SCR allowing for latch-up free SCR design. The active FET times out in a short time period (e.g., microseconds) thus shutting off the SCR feedback mechanism making the SCR latch-up immune.

18 Claims, 4 Drawing Sheets

VARIABLE HOLDING VOLTAGE SILICON CONTROLLED RECTIFIER USING SEPARATE AND DISTINCT BIPOLARS

TECHNICAL FIELD

This disclosure relates generally to the field of silicon controlled rectifiers and more particularly to variable holding voltage silicon controlled rectifiers.

BACKGROUND

Generally, electrostatic discharge (ESD) is one of the major reasons for destruction of semiconductor integrated circuits. ESD is considered as a major reliability threat in the semiconductor industry. Silicon Controlled Rectifiers (SCR) are commonly used as protection device in integrated circuits. SCR's are very efficient energy absorbers; however, they are prone to latch up. Typically, SCRs are integrated with the NPN and PNP structure of an integrated circuit sharing wells to decrease the holding voltage and increase the robustness of the SCR. Integrated SCRs are typically custom built for a given voltage rating.

The NPN and PNP structures, which constitute the integrated SCRs, have different electrical characteristics as a function of current. For example, the PNP typically has a lower gain than NPN at low and medium current densities and its current gain begin to decrease at a lower current density. In an integrated SCR construction, it is not possible to independently optimize gain with NPN or the PNP structures. This leads to non-optimized designs. In many cases, PNP gain can be too low for building an acceptable SCR structure. An additional drawback of integrated SCR's is that they have a low and difficult to modulate holding voltage and are prone to latch-up. The holding voltage in integrated SCR's are difficult to modulate since the internal feedback terminals of the SCR are not accessible. Variable holding voltages in integrated SCR's are achieved by changing anode to cathode spacing or by reducing the positive feedback with parasitic paths, which reduces their robustness and speed.

SUMMARY

According to an embodiment, a semiconductor device is disclosed. The semiconductor device includes a substrate, a first N-type layer positioned in the substrate, a first P-type layer formed in the first N-type layer, the first P-type layer having a collector of a first bipolar transistor, a first N+ type layer positioned over the first P-type layer, the first N+ type layer forming a base of the first bipolar transistor, a first P+ type layer positioned over the first N+ type layer, the first P+ type layer forming an emitter of the first bipolar transistor, a second N-type layer positioned in the substrate, the second N-type layer is isolated from the first N-type layer by a shallow trench isolation, the second N-type layer having a collector of a second bipolar transistor, a second P+ type layer positioned over the second N-type layer, the second P+ type layer forming a base of the second bipolar transistor, and a second N+ type layer positioned over the second P+ type layer, the second N+ type layer forming an emitter of the second bipolar transistor.

According to another embodiment, an electrostatic discharge device is disclosed. The electrostatic discharge device includes a substrate, a first N-type layer positioned in the substrate, a first P-type layer formed in the first N-type layer, a first N+ type layer positioned over the first P-type layer, a first P+ type layer positioned over the first N+ type layer, a second N-type layer positioned in the substrate, the second N-type layer is isolated from the first N-type layer by a shallow trench isolation, a second P+ type layer positioned over the second N-type layer, a second N+ type layer positioned over the second P+ type layer, a first bipolar transistor having, an emitter in the first P+ type layer, a base in the first N+ type layer, and a collector in the first P-type layer; and a second bipolar transistor having an emitter in the second N+ type layer, a base in the second P+ type layer, and a collector in the second N-type layer.

In accordance with yet another embodiment, an electrostatic discharge circuitry is disclosed. The electrostatic discharge circuitry includes a first bipolar transistor, a second bipolar transistor, wherein a collector of the first bipolar transistor is coupled to a base of the second bipolar transistor, an emitter of the first bipolar transistor is coupled to a base of the first bipolar transistor and a collector of the second bipolar transistor via a first restive element, an emitter of the second bipolar transistor is coupled to the base of the second bipolar transistor via a second resistive element, the emitter of the first bipolar transistor is further coupled to a first contact pad, and the emitter of the second bipolar transistor is further coupled to a second contact pad.

In accordance with yet another embodiment, an electrostatic discharge device is disclosed. The electrostatic discharge device includes a substrate, a first N-type layer positioned in the substrate, a first P-type layer formed in the first N-type layer, a first N+ type layer positioned over the first P-type layer, a second N+ type layer positioned over the first P-type layer, a first P+ type layer positioned over the first N+ type layer, a second P+ type layer positioned over the second N+ type layer, a second N-type layer positioned in the substrate, the second N-type layer is isolated from the first N-type layer by a shallow trench isolation, a third P+ type layer positioned over the second N-type layer, a third N+ type layer positioned over the third P+ type layer, a first bipolar transistor having an emitter in the first P+ type layer, a base in the first N+ type layer, and a collector in the first P-type layer; and a second bipolar transistor having an emitter in the second P+ type layer, a base in the second N+ type layer, and a collector in the first P-type layer; and a third bipolar transistor having an emitter in the third N+ type layer, a base in the third P+ type layer, and a collector in the second N-type layer.

DETAILED DESCRIPTION

The following description provides many different embodiments, or examples, for implementing different features of the subject matter. These descriptions are merely for illustrative purposes and do not limit the scope of the invention.

Figure 1A:
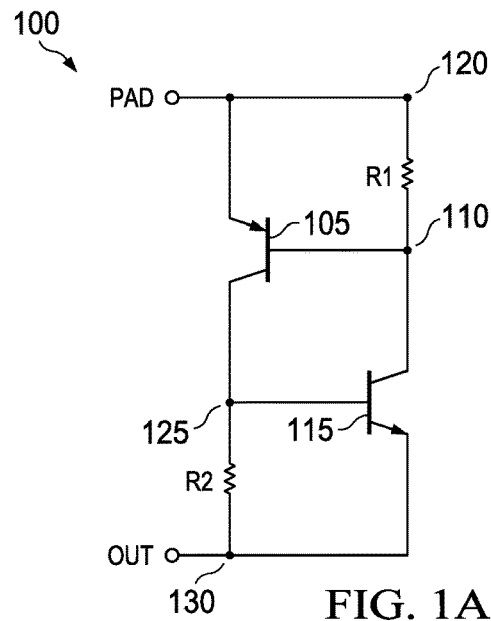
FIG. 1A illustrates an exemplary circuit configuration for an SCR using separate bipolar components according to an embodiment.

Referring to FIG. 1A, an exemplary circuit configuration 100 for an SCR using separate bipolar components is illustrated according to an embodiment. Circuit 100 includes a PNP transistor 105 and an NPN transistor 115. Emitter of transistor 105 is coupled with base of transistor 105 via a resistor R1 between nodes 110 and 120 and accessible at a contact point PAD. Resistor R1 can be of any value to provide appropriate bias for base of transistor 105 (e.g., 100 ohms or the like). Similarly, emitter of transistor 115 is coupled with base of transistor 115 via a resistor R2 between nodes 125 and 130 and accessible at a contact point OUT. Resistor R2 may be selected such to provide appropriate bias to transistor 115. In the exemplary embodiment, base of transistor 115 is coupled with collector of transistor 105 through a metal connection. The illustrated separate bipolar SCR circuit allows for independent optimization of the constituent NPN and PNP. Typically, gain of PNP starts to decrease at a lower current density than NPN thus, the structure of PNP transistors can be made larger than NPN transistors for optimal design. In processes where NPN gain is low, same technique can be adopted to improve the gain of the NPN. Change of size of individual transistors in an integrated structure is not possible due to integrated SCR design.

Figure 1C:
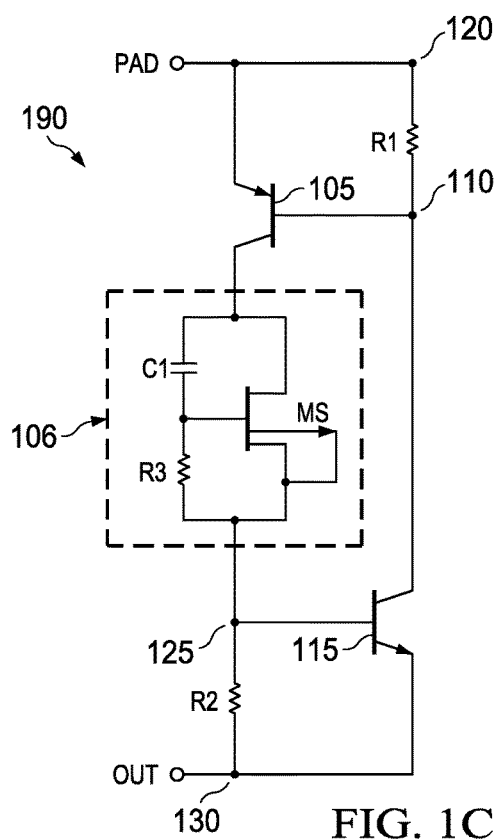
FIG. 1C illustrates an exemplary circuit configuration of a latch-up free SCR using separate bipolar components according to an embodiment.
Figure 1B:
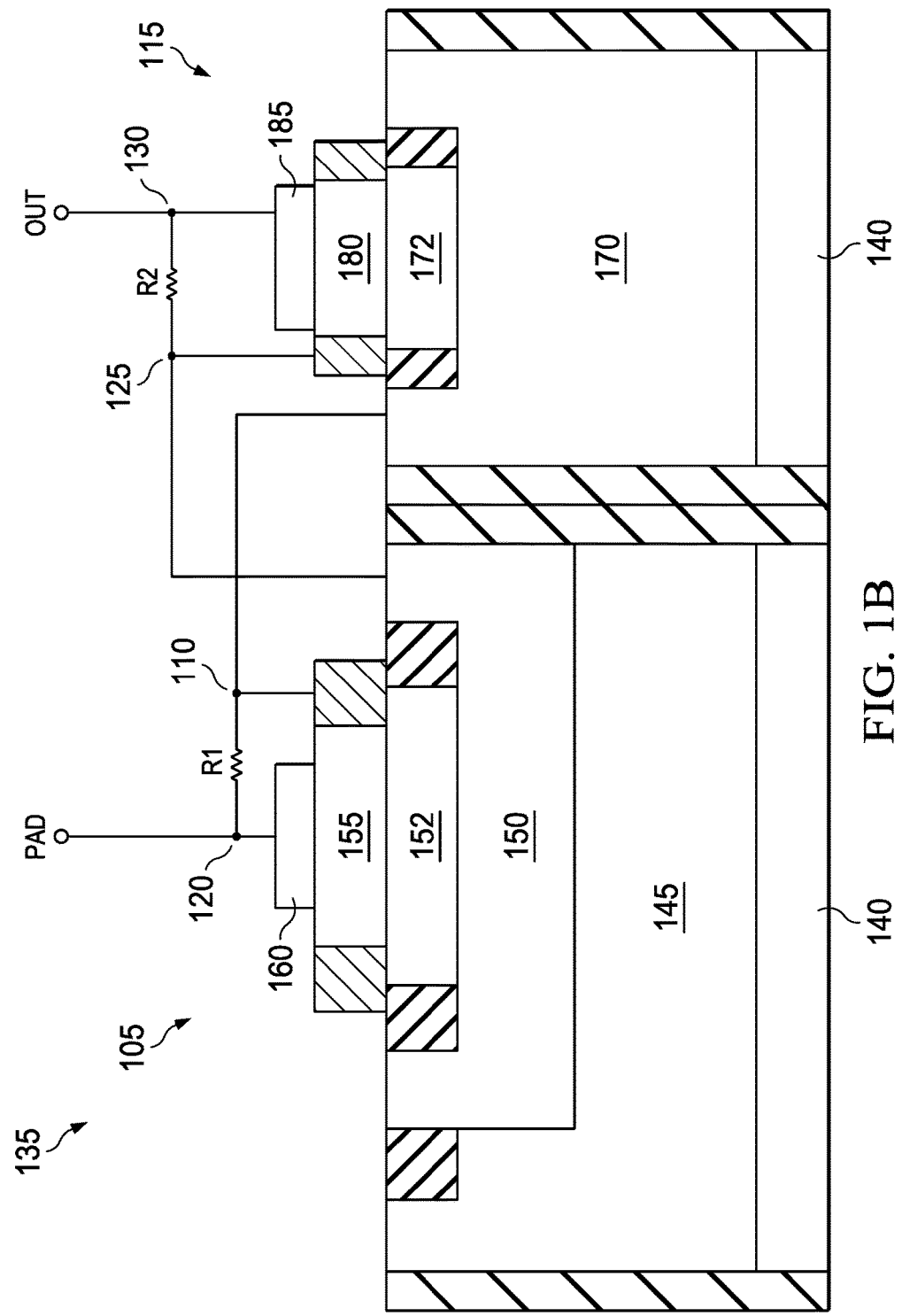
FIG. 1B illustrates an exemplary cross-sectional view of a semiconductor structure for a SCR using separate bipolar components according to an embodiment.

Referring to FIG. 1B, an exemplary cross-sectional view of a semiconductor structure 135 of separate bipolar SCR circuit 100 is illustrated according to an embodiment. Structure 135 represents PNP transistor 105 and NPN transistor 115 on a P-type substrate 140. Transistor 105 includes an N-type Isolation layer 145 diffused with a heavy doped P-type layer 150 (e.g., P+ type layer), which forms collector of transistor 105. A lightly doped P-layer 152 is positioned over heavily doped P-type layer 150, which allows the PNP to operate at a high voltage. A heavily doped N-type layer 155 is positioned over lightly doped P-layer 150 and forms a base of transistor 105. A P+ layer is positioned over N-type layer 155 and forms an emitter 160 of transistor 105. Typically, a heavy doped layers have conductive carrier (electron or holes) concentration of greater than $10^{18}/cm3$ and lightly/regularly doped layers have carrier concentration (electron or holes) between $10^{16}/cm^3$ to $10^{18}/cm^3$. Thus an N+ layer will have an electron concentration of greater than $10^{18}/cm^3$ and similarly, a P+ layer will have a hole concentration of greater than $10^{18}/cm^3$.

Similarly, NPN transistor 115 is formed using an N-type isolation layer 170 forming collector of transistor 115, a lightly doped N-layer 172 positioned over N-type layer 170, a heavily doped P-type layer 180 positioned over lightly doped N-layer 172 forming base of transistor 115, and an N+ layer positioned over P-type layer 180 forming emitter of transistor 115. N-type layers 145 and 170 can be the same layer with shallow trench isolation for forming different transistor structures on the same substrate 140. To form SCR circuit 100 as illustrated in FIG. 1A, base 155 of PNP transistor 105 may be connected with collector 170 of NPN transistor 115 and collector 150 of PNP transistor 105 may be connected with base of NPN transistor 115 using internal metal connection within semiconductor structure 135. Nodes 110, 120, 125, and 130 can be accessible outside the semiconductor structure 135 using suitable contact points to provide appropriate bias resistors R1 and R2 to form circuit 100 as illustrated in FIG. 1A. Use of separate bipolar structure as illustrated in FIG. 1B, eliminates limitations of integrated SCR where PNP and NPN transistor structures are dependent on the formation of various P-type and N-type layers specifically formed for other circuit elements in the integrated circuit. As stated herein above, separate bipolar structure 135 enables the adjustment of gain for both PNP and NPN transistors by changing their respective sizes for optimal design. Separate bipolar SCR structure enables access to internal feedback terminals of the SCR (nodes 110 and 125), which then may be used to custom design latch up immune solutions.

Referring to FIG. 1C, an exemplary circuit configuration 190 of a latch-up free SCR using separate bipolar components is illustrated according to an embodiment. Circuit 190 is similar to the circuit 100 as illustrated in FIG. 1A but with an additional timer circuit 106 integrated into the internal feedback node of the SCR for example, between collector of transistor 105 and base of transistor 115. Timer circuit 106 can be configured using any active field-effect transistor (FET). In the exemplary illustration, timer circuit 106 includes an active FET MS, a capacitor C1, and a resistor R3. A drain of FET MS is coupled to collector of transistor 105 and a first end of capacitor C1. A body terminal and source of FET MS are coupled together and are coupled to base of transistor 115. Gate of FET MS is coupled to a second end of capacitor C1 and resistor R3. Resistor R3 is coupled to source of FET MS and base of transistor 115. Timer circuit 106 turns itself off after a pre-determined time thereby avoiding latch up of the SCR circuit 190. The active FET times itself out in a time period, which can be set by the combination of resistor R3 and capacitor C1 of the circuit (e.g., in microseconds) thus shutting off the SCR feedback mechanism making the SCR latch-up immune. In the present example, illustrated FET MS is a n-channel FET; however, one skilled in the art will appreciate that polarities of FET MS and transistors 105 and 115 can be reversed according to a particular given implementation.

According to an embodiment, high voltage and high current gain bipolars (e.g., SiGe complementary bipolars) may be used for the SCR and the active FET can be a low voltage active FET, which can optimize the space utilization on semiconductor substrate. The area of the active FET on the semiconductor substrate can be kept relatively smaller depending on the gain of NPN and PNP structures. This enables robust latch-up immunity for SCR. The configuration according to an embodiment, enables modulation of holding voltage of SCR using circuit techniques. In an embodiment, the gate of the active FET circuit can be connected to a shut off terminal which lowers the gate potential during normal operation. This provides transient latch-up immunity to the SCR. Timer circuit 106 can also be inserted between base of PNP transistor 105 and collector of the NPN transistor 110. In this case, timer circuit 106 can be constructed using components that can tolerate the rated voltage on PAD. The location and size of the timer circuit 106 (active FET) can be based on the relative gain of the NPN and PNP to optimize total area.

In conventional integrated SCR configuration, contact points PAD and OUT cannot access bases of transistor 105 and 115 due to the integrated structure of the SCR built with other circuit elements within integrated circuit. According to an embodiment, SCR circuit 100 (190) may be configured using separate bipolar components such that contact points PAD and OUT may provide access to bases of transistors 105 and 115, which can be selectively charged to manage positive feedback, thus controlling the parasitic current paths of SCR resulting in desired variable holding voltage for SCR. According to another embodiment, an electronic switch (e.g., transistor, diode, or similar switch) can be added in place of or in addition to resistors R1 and R2 to dynamically configure the holding voltage of SCR circuit 100.

Figure 2C:
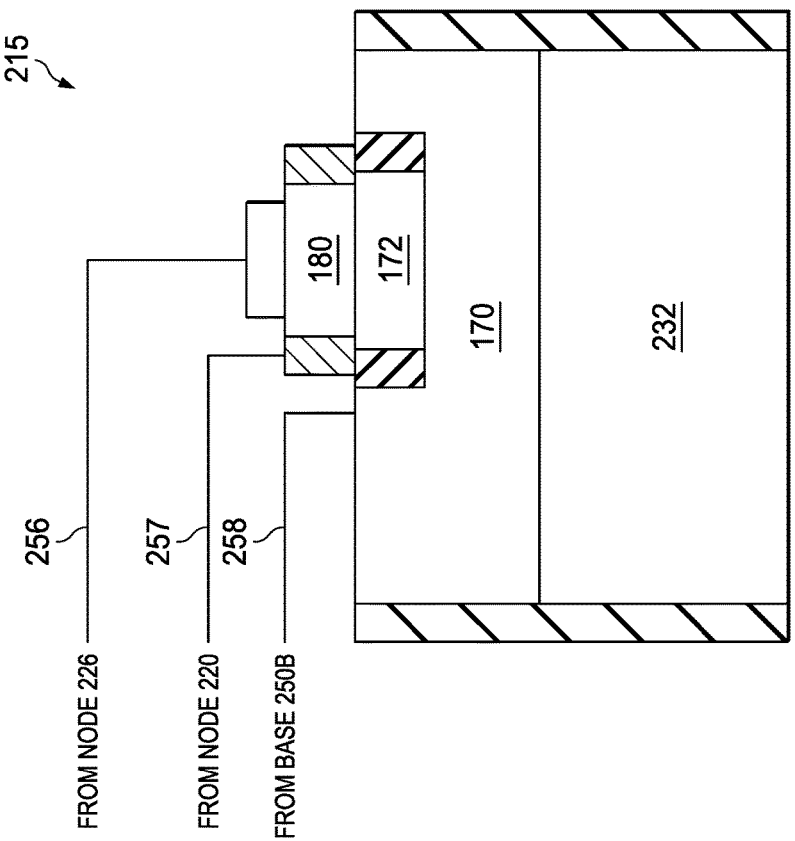
FIGS. 2B and 2C illustrate an exemplary cross-sectional view of an integrated semiconductor structure using a separate Darlington pair for providing improved SCR action and variable holding voltages according to an embodiment.
Figure 2A:
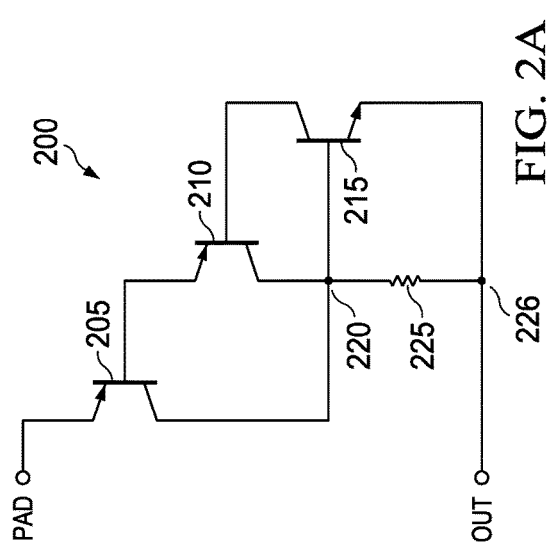
FIG. 2A illustrates an exemplary circuit for an SCR using a separate Darlington pair for providing improved SCR action and variable holding voltages according to an embodiment.

Referring to FIG. 2A, an exemplary circuit 200 for a SCR using a separate Darlington pair for providing improved SCR action and variable holding voltages is illustrated according to an embodiment. Because gain of PNP transistor is generally low, illustrated circuit configuration allows for independently improving gain of PNP transistor. The number of Darlington stages can be varied depending on the gain requirements and/or holding voltage constraints. Circuit 200 includes transistors 205, 210, and 215. Transistors 210 and 215 form an SCR configuration similar to the circuit configuration 100; however, in circuit configuration 200, instead of a single PNP transistor, two PNP transistors are used to improve the effective current gain. In the exemplary illustration, transistors 205 and 210 form a known configuration of Darlington pair, providing higher current gain for SCR circuit 200. While for exemplary purposes, a single Darlington pair is illustrated; however, multiple Darlington pairs can be added to circuit 200 to provide appropriate current gain and modulate holding voltage for a given application.

The number of Darlington stages can be configured in semiconductor structure by changing pad connection from emitter of one stage (for example emitter of transistor 205) to emitter of a different stage (e.g., emitter of transistor 210). In the exemplary illustration, emitter of transistor 215 is coupled with base of transistor 215 via a resistor 225 at node 226. Node 220 further provides common connection for collectors of transistors 205 and 210. Resistor 225 can be of any value for providing appropriate bias for base of transistor 215 (e.g., 100 ohms or the like). During operation, bias to base of transistor 215 can be adjusted using contact terminal OUT to modulate holding voltage for SCR circuit 200. This enables dynamic configuration of holding voltage for SCR circuit 200. According to another embodiment, the timing circuit of FIG. 1C can be added to the Darlington pair configuration of FIG. 2A to provide lath-up immune configuration.

Figure 2B:
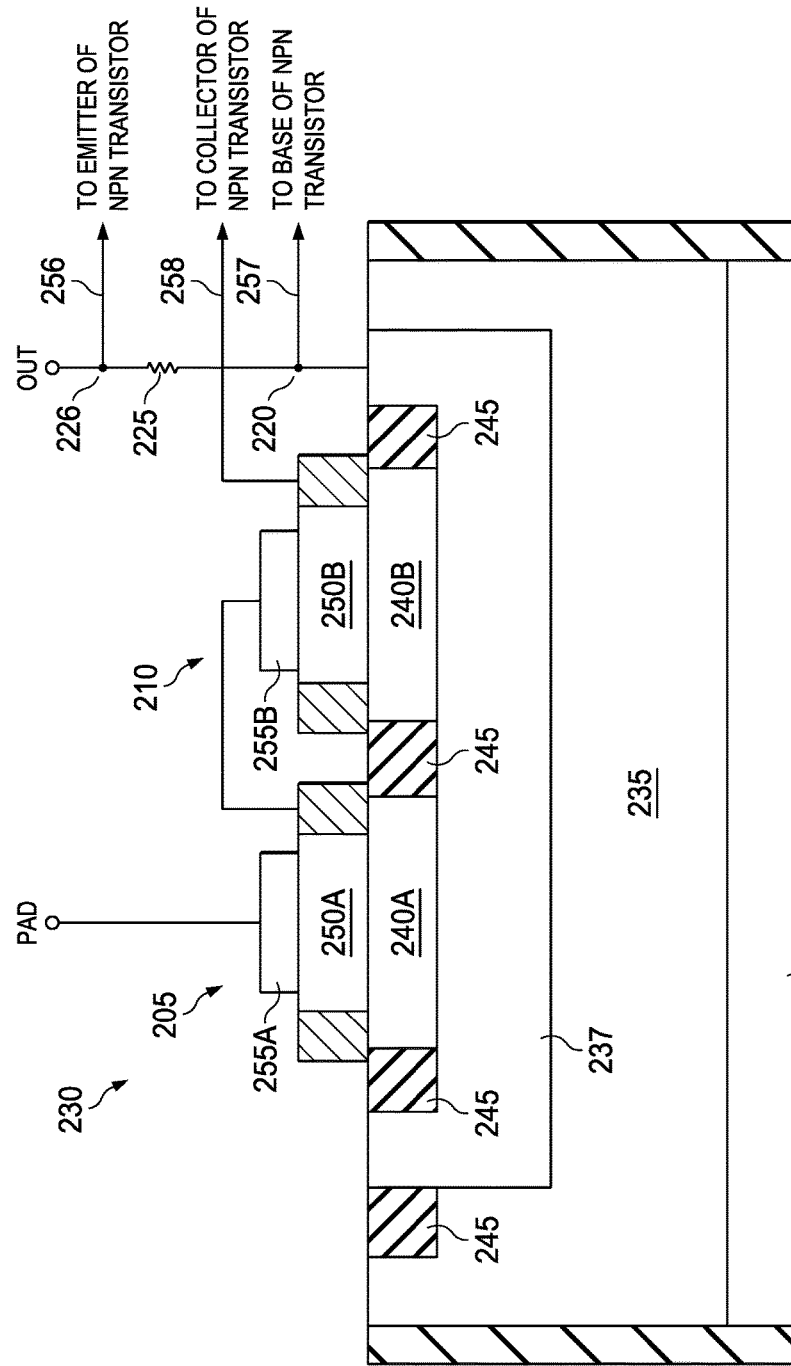

Referring to FIGS. 2B and 2C, an exemplary cross-sectional view of an integrated semiconductor structure 230 using a separate Darlington pair for providing improved SCR action and variable holding voltages is illustrated according to an embodiment. Structure 230 may represent Darlington pair of transistors 205 and 210 as illustrated in FIG. 2A. Structure 230 includes a P-type substrate 232. An N-type isolation layer 235 formed in P-type substrate 232 with a heavy doped N-type material. A heavily doped P-type layer 237 is positioned over N-type isolation layer 235 and forms a shared collector for two transistors, for example transistors 205 and 210 as illustrated in FIG. 2A. A lightly doped P-type layer positioned over heavily doped P-type layer 237 is split into two lightly doped P-type sublayers 240A and 240B using shallow trench isolations 245. This allows building of two transistors for Darlington pair configuration. While for exemplary purposes, two transistor structure is shown for one Darlington pair; however, as stated hereinabove, multiple Darlington pairs can be formed to provide appropriate gain for any particular circuit configuration.

A heavily doped N-type layer 250A is formed over P-type layer 240A and a heavily doped N-type layer 250B is formed over P-type layer 240B, forming bases for two transistors such as for example transistors 105 and 110 respectively. A P+ layer 255A is positioned over N-type layer 250A forming an emitter of one transistor, e.g., transistor 205, and a P+ layer 255B is formed over N-type layer 250B forming an emitter of another transistor, e.g., transistor 210, of Darlington pair. To form an SCR configuration using Darlington pair as illustrated in FIG. 2A, emitter 255B, e.g., of transistor 210, may be connected with base 250A, e.g., of transistor 205, using internal metal connection of integrated semiconductor structure 230. An external connection PAD may be formed to connect with emitter 255A to provide access to transistor, e.g., transistor 205. Base 250B, e.g., of transistor 210, may be connected to collector of an NPN transistor such as transistor 215 as illustrated in FIG. 2C using internal metal connection 258.

NPN transistor 215 as illustrated in FIG. 2C can be formed on P-type substrate 232 using various forms such as for example similar to transistor 115 as illustrated in FIG. 1B. The structure of NPN transistor 215 is similar to transistor 115 and formation of transistor 215 is explained hereinabove with reference to transistor 115. The shared collector 237 for example of transistors 205 and 210, may be connected to base of NPN transistor 215 using internal metal connection 257. An external contact OUT for shared collector 237 (and base of NPN transistor 215) may be provided at node 220, which can be used to adjust bias of NPN transistor 215 using a resistor for example resistor 225. Emitter of NPN transistor 215 may be connected with external contact OUT at node 226 using metal connector 256. While for exemplary purposes, specific polarities of various semiconductor layers are illustrated; however, one skilled in the art will appreciate that these polarities can be reversed to provide opposite polarity configuration.

Typically, in standard integrated SCR, the internal contacts with base 250A of PNP transistor (e.g., transistor 205) or shared collector 237 cannot be accessed due to the integrated structure of SCR. Similarly, collector/base contact 257 of PNP/NPN transistor also cannot be accessed in typical integrated SCR circuit. According to exemplary embodiments, various SCRs can be configured using separate bipolars instead of integrated semiconductor structure. In exemplary embodiments, each PNP/NPN transistor is configured individually. This allows access to various connection nodes of SCR, which can be used to provide appropriate bias and feedback using various resistor networks. With selection of resistor network, holding voltage of exemplary embodiments of SCR can be dynamically configured by adjusting positive feedback in parasitic path of SCR. The positive feedback in parasitic path may be used to custom design latch up immune solutions for SCRs in given integrated circuits.

Figure 3:
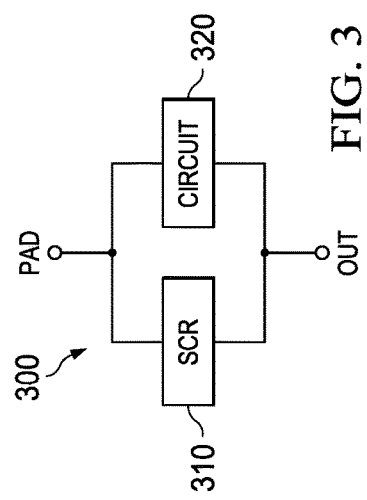
FIG. 3 illustrates an exemplary implementation circuit using an SCR with separate bipolar components according to an embodiment.

Referring to FIG. 3, an exemplary implementation circuit 300 using an SCR with separate bipolar components is illustrated according to an embodiment. Circuit 300 includes a SCR 310 configured using various embodiments explained hereinabove with reference to FIGS. 1A-2C. A circuit 320 can be any circuit requiring ESD protection. While for exemplary purposes, SCR 310 and Circuit 320 are shown as individual units; however these can be integrated on same substrate with SCR built using separate bipolar components. As stated hereinabove, SCR 310 with separate bipolar components enables adjustment of gain of transistors by changing their respective sizes for optimal design. Further, internal feedback terminals of SCR 310 can be accessed and may be used to custom design latch up immune solutions.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims. Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device comprising:
    a substrate;
    a first N-type layer positioned in the substrate;
    a first P-type layer formed in the first N-type layer, the first P-type layer having a collector of a first bipolar transistor;
    a first N+ type layer positioned over the first P-type layer, the first N+ type layer forming a base of the first bipolar transistor;
    a first P+ type layer positioned over the first N+ type layer, the first P+ type layer forming an emitter of the first bipolar transistor;
    a second N-type layer positioned in the substrate, the second N-type layer is isolated from the first N-type layer by a shallow trench isolation, the second N-type layer having a collector of a second bipolar transistor;
    a second P+ type layer positioned over the second N-type layer, the second P+ type layer forming a base of the second bipolar transistor; and
    a second N+ type layer positioned over the second P+ type layer, the second N+ type layer forming an emitter of the second bipolar transistor, wherein the emitter of the first bipolar transistor is coupled to a first contact pad and further coupled to the base of the first bipolar transistor and collector of the second transistor via a first resistive element.

2. The semiconductor device of claim 1, wherein the first and second N type layers are integrated into a single N-type layer positioned in the substrate.

3. The semiconductor device of claim 1, wherein the first P-type layer is a P+ type layer, and the semiconductor device further comprising:
    a lightly doped P-type layer positioned over the first P-type layer and below the first N+ type layer; and
    a lightly doped N-type layer positioned over the second N-type layer and below the second P+ type layer.

4. The semiconductor device of claim 1, wherein,
    the base of the first bipolar transistor is coupled to the collector of the second bipolar transistor,
    the collector of the first bipolar transistor is coupled to the base of the second bipolar transistor and further coupled to a second contact pad and the emitter of the second bipolar transistor via a second resistive element.

5. The semiconductor device claim 4, wherein the first and second resistive elements are 100 ohm resistors.

6. An electrostatic discharge device comprising:
    a substrate;
    a first N-type layer positioned in the substrate;
    a first P-type layer formed in the first N-type layer;
    a first N+ type layer positioned over the first P-type layer;
    a first P+ type layer positioned over the first N+ type layer;
    a second N-type layer positioned in the substrate, the second N-type layer is isolated from the first N-type layer by a shallow trench isolation;
    a second P+ type layer positioned over the second N-type layer;
    a second N+ type layer positioned over the second P+ type layer;
    a first bipolar transistor having:
        an emitter in the first P+ type layer,
        a base in the first N+ type layer, and
        a collector in the first P-type layer; and
    a second bipolar transistor having:
        an emitter in the second N+ type layer,
        a base in the second P+ type layer, and
        a collector in the second N-type layer, wherein the emitter of the first bipolar transistor is coupled to a first contact pad and further coupled to the base of the first bipolar transistor and collector of the second transistor via a first resistive element.

7. The electrostatic discharge device of claim 6, wherein the first and second N type layers are integrated into a single N-type layer positioned in the substrate.

8. The electrostatic discharge device of claim 6, wherein the first P-type layer is a P+ type layer, and the semiconductor device further comprising:
    a lightly doped P-type layer positioned over the first P-type layer and below the first N+ type layer; and a lightly doped N-type layer positioned over the second N-type layer and below the second P+ type layer.

9. The electrostatic discharge device of claim 6, wherein, the base of the first bipolar transistor is coupled to the collector of the second bipolar transistor,
the collector of the first bipolar transistor is coupled to the base of the second bipolar transistor and further coupled to a second contact pad and the emitter of the second bipolar transistor via a second resistive element.

10. The electrostatic discharge device claim 9, wherein the first and second resistive elements are 100 ohm resistors.

11. An electrostatic discharge circuitry, comprising:
a first bipolar transistor;
a second bipolar transistor, wherein
    a collector of the first bipolar transistor is coupled to a base of the second bipolar transistor,
    an emitter of the first bipolar transistor is coupled to a base of the first bipolar transistor and a collector of the second bipolar transistor via a first restive element,
    an emitter of the second bipolar transistor is coupled to the base of the second bipolar transistor via a second resistive element,
    the emitter of the first bipolar transistor is further coupled to a first contact pad, and
    the emitter of the second bipolar transistor is further coupled to a second contact pad.

12. The electrostatic discharge circuitry of claim 11, wherein the collector of the first bipolar transistor is coupled to the base of the second bipolar transistor via a timing circuitry where in the timing circuitry comprising;
a field effect transistor, wherein
    a drain of the field effect transistor is coupled to the collector of the first bipolar transistor and a capacitive element,
    a substrate terminal of the field effect transistor is coupled to a source of the field effect transistor,
    the source of the field effect transistor is coupled to a gate of the field effect transistor via a third resistive element, and further coupled to the base of the second bipolar transistor, and
    the gate of the field effect transistor is coupled to the capacitive element.

13. An electrostatic discharge circuitry, comprising:
a first bipolar transistor;
a second bipolar transistor, wherein
    a base of the first bipolar transistor is coupled to an emitter of the second bipolar transistor,
    a collector of the first bipolar transistor is coupled to a collector of the second bipolar transistor, and
    an emitter of the first bipolar transistor is coupled to a first pad terminal; and
a third bipolar transistor, wherein
    a base of the third transistor is coupled to the collectors of the first and second bipolar transistors,
    a collector of the third transistor is coupled to a base of the second bipolar transistor, and
    an emitter of the third bipolar transistor is coupled to the base of the third transistor via a resistive element and further coupled to a second pad terminal.

14. An electrostatic discharge device comprising:
a substrate;
a first N-type layer positioned in the substrate;
a first P-type layer formed in the first N-type layer;
a first N+ type layer positioned over the first P-type layer;
a second N+ type layer positioned over the first P-type layer;
a first P+ type layer positioned over the first N+ type layer;
a second P+ type layer positioned over the second N+ type layer;
a second N-type layer positioned in the substrate, the second N-type layer is isolated from the first N-type layer by a shallow trench isolation;
a third P+ type layer positioned over the second N-type layer;
a third N+ type layer positioned over the third P+ type layer;
a first bipolar transistor having:
    an emitter in the first P+ type layer,
    a base in the first N+ type layer, and
    a collector in the first P-type layer; and
a second bipolar transistor having:
    an emitter in the second P+ type layer,
    a base in the second N+ type layer, and
    a collector in the first P-type layer; and
a third bipolar transistor having:
    an emitter in the third N+ type layer,
    a base in the third P+ type layer, and
    a collector in the second N-type layer.

15. The electrostatic discharge device of claim 14, wherein the first and second N type layers are integrated into a single N-type layer positioned in the substrate.

16. The electrostatic discharge device of claim 14, wherein the first P-type layer is a P+ type layer, and the semiconductor device further comprising:
a first lightly doped P-type layer positioned over the first P-type layer and below the first N+ type layer;
a second lightly doped P-type layer positioned over the first P-type layer and below the second N+ type layer;
a lightly doped N-type layer positioned over the second N-type layer and below the third P+ type layer.

17. The electrostatic discharge device of claim 14, wherein
the emitter of the first bipolar transistor is coupled to a first contact pad.

18. The electrostatic discharge device of claim 17, wherein,
the base of the first bipolar transistor is coupled to the emitter of the second bipolar transistor,
the base of the second bipolar transistor is coupled to the collector of the third bipolar transistor,
the collectors of the first and the second bipolar transistors are coupled to the base of the third bipolar transistor and further coupled to the emitter of the third bipolar transistor and a second contact pad via a first resistive element.

* * * * *